United States Patent
Nagano et al.

(10) Patent No.: US 7,053,436 B2
(45) Date of Patent: May 30, 2006

(54) SEMICONDUCTOR DEVICE AND METHOD FOR FABRICATING THE SAME

(75) Inventors: Yoshihisa Nagano, Osaka (JP); Toshie Kutsunai, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 198 days.

(21) Appl. No.: 10/752,668

(22) Filed: Jan. 8, 2004

(65) Prior Publication Data

US 2004/0185653 A1 Sep. 23, 2004

(30) Foreign Application Priority Data

Mar. 19, 2003 (JP) ............................. 2003-074874

(51) Int. Cl.
*H01L 27/108* (2006.01)

(52) U.S. Cl. .................... 257/310; 257/296
(58) Field of Classification Search ............... 257/295, 257/296, 298, 310
See application file for complete search history.

(56) References Cited

U.S. PATENT DOCUMENTS

| | | | |
|---|---|---|---|
| 5,851,896 A * | 12/1998 | Summerfelt | 438/396 |
| 5,877,062 A | 3/1999 | Horii | |
| 6,043,529 A | 3/2000 | Hartner et al. | |
| 6,730,951 B1 | 5/2004 | Nagano et al. | |
| 6,815,226 B1 * | 11/2004 | Lee et al. | 438/3 |

FOREIGN PATENT DOCUMENTS

| CN | 1231771 A | 10/1999 |
|---|---|---|
| CN | 1393931 A | 1/2003 |

* cited by examiner

*Primary Examiner*—Bradley K. Smith
(74) *Attorney, Agent, or Firm*—McDermott Will & Emery LLP

(57) ABSTRACT

A conductive oxygen barrier layer is formed on an interlayer dielectric film and patterned such that it is in contact with the top surface of a contact plug to prevent the diffusion of oxygen into the contact plug from above. The conductive oxygen barrier layer is composed of a lower layer containing a conductive nitride such as TiAlN, and an upper layer containing a conductive oxide such as $IrO_2$. An insulative oxygen barrier layer composed of $Al_2O_3$ and having a thickness of approximately 20 nm is formed on the side surfaces of the conductive oxygen barrier layer to prevent the diffusion of oxygen into the contact plug from the sides, such as from the sides of the lower layer of the conductive barrier layer.

10 Claims, 7 Drawing Sheets

SEMICONDUCTOR DEVICE AND METHOD FOR FABRICATING THE SAME

BACKGROUND OF THE INVENTION

The present invention relates to a semiconductor device including a capacitor having a three-dimensional structure that allows high integration.

In pace with the recent development of digital technology and the need of processing and storing large quantity of digital data, the development of high functioning electronic equipments and the downsizing of semiconductor devices have also significantly accelerated. Accordingly, in order to achieve a highly integrated dynamic RAM, research and development on a novel method of using a high dielectric material as a substitute of the conventional silicon oxide or silicon nitride in a capacitive insulating film have been widely undertaken.

In addition, research and development related to ferroelectric films having spontaneous polarization property, and aiming at producing a practical and non volatile RAM that can operates in a low operational voltage and at a high reading and writing speed have also been carried out extensively.

In order for a capacitor, in which an insulating metal oxide composed of high dielectric material, ferroelectric material or the like is used in a capacitive insulating film, to be applicable to a highly integrated mega-bite memory, it is required of the capacitor to have a small surface area and yet a three-dimensional structure having a large capacitance.

A conventional capacitor will be described with reference to a drawing as follows.

FIG. 7 illustrates a cross-sectional structure of the main part of a conventional capacitor (see for example, U.S. Pat. No. 5,877,062).

As shown in FIG. 7, an interlayer dielectric film 101 is formed on a semiconductor substrate 100, and a contact plug 102 composed of polysilicon is formed within the interlayer dielectric film 101. Next, an oxygen diffusion barrier layer 103 composed of patterned conductive nitride is formed over the interlayer dielectric film 101 and the contact plug 102, and a lower electrode 104 is formed thereon. The oxygen diffusion barrier layer 103 is composed of a material such as titanium nitride (TiN), titanium aluminum nitride (TiAlN), titanium silicon nitride (TiSiN), tantalum silicon nitride (TaSiN), tantalum aluminum nitride (TaAlN), or tungsten nitride (WN), and the lower electrode 104 is composed of a material such ruthenium (Ru), iridium (Ir), platinum (Pt), osmium (Os), palladium (Pd), tungsten (W), molybdenum (Mo) or cobalt (Co).

The oxygen diffusion barrier layer 103 and the lower electrode 104 are completely covered by a protective layer 105, such that the protective layer 105 is in contact with the sides of the oxygen diffusion barrier layer 103 and the sides and top surface of the lower electrode 104. The protective layer 105 is selectively formed on the sides of the oxygen diffusion barrier layer 103 and the sides and top surface of the lower electrode 104 by electroplating, and is composed of a material such as ruthenium (Ru), iridium (Ir), platinum (Pt), osmium (Os), tungsten (W), molybdenum (Mo), cobalt (Co), nickel (Ni), gold (Au) or silver (Ag). A capacitive insulating film 106 composed of a high dielectric or ferroelectric material is formed covering the protective layer 105, and an upper electrode 107 is then formed covering the capacitive insulating film 106.

According to reference 1, crystallization of the capacitive insulating film 106 is performed by a heat treatment in an oxygen ambient and under a temperature between 500° C. and 800° C. inclusively. The protective layer 105 has a function of preventing oxygen atoms from diffusing into the inner portion of the oxygen diffusion barrier layer 103 from the sides, and thus an increase in resistance caused by oxidation of the surface of the contact plug 102 can be prevented.

After substantial study and research, the applicants of the present invention arrived at a conclusion that it is not possible to fabricate a highly integrated mega-bite memory from a conventional capacitor provided with the protective layer 105, which prevents oxidation of the contact plug 102. The reasons are as follows.

From experiments, the applicants discovered that among the materials used for composing the protective layer 105 that protects the contact plug 102 from oxidation, only iridium (Ir) is capable of preventing the diffusion of oxygen during the heat treatment, which is performed under a temperature between 500° C. and 800° C. inclusively, for crystallizing the capacitive insulating film 106. Moreover, in order to prevent the sides of the oxygen diffusion barrier layer 103 from being oxidized, the thickness of the iridium has to be 100 nm or more. In other words, if the protective layer 105 is provided in a conventional capacitor, the size of the capacitor in the horizontal direction will increase by 200 nm (two layers of 100 nm) with respect to the surface of the substrate.

In order to achieve a highly integrated mega-bite memory, the size of the lower electrode in the horizontal direction cannot be more than 500 nm. However, if the protective layer 105 having a thickness of at least 100 nm is provided in a conventional capacitor, the size of the lower electrode 104 in the horizontal direction, in addition with the two layers of the protective layer 105 measuring at least 200 nm, becomes at least 700 nm. As a result, since each capacitor is 1.4 times larger than the desirable design dimension, a low cost production of highly integrated memory cannot be achieved. Hence, a highly integrated mega-bite memory cannot be produced from a conventional capacitor.

In addition, since the protective layer 105 is formed by electroplating, materials other than metals cannot be used.

SUMMARY OF THE INVENTION

The object of the present invention is to solve the aforementioned conventional problem, and to prevent the oxidation of the contact plug even if the surface area of the capacitor connected to the contact plug is small.

In order to achieve this object, in the present invention, a first oxygen barrier layer formed on the contact plug and having a conducting property, and a second oxygen barrier layer formed on the side surfaces of the first oxygen barrier layer and having an insulating property are provided in a semiconductor device including a capacitor connected to a contact plug.

Specifically, the semiconductor device in the present invention includes: a contact plug formed within an interlayer dielectric film provided on a semiconductor region, and is electrically connected to the semiconductor region; a first oxygen barrier layer formed on the interlayer dielectric film to be in contact with the contact plug, the first oxygen barrier layer has a conducting property and prevents the diffusion of oxygen; a second oxygen barrier layer formed in contact with the side surfaces of the first oxygen barrier layer, the second oxygen barrier layer has an insulating property and prevents the diffusion of oxygen; a lower electrode formed in contact with the top surface of the first oxygen barrier layer; a capacitive insulating film formed in contact with the lower electrode; and an upper electrode formed in contact with the capacitive insulating film.

According to the semiconductor device of the present invention, since an insulating material can be selected for the second oxygen barrier layer, which corresponds to the protective layer in the conventional capacitor, even if the thickness of the second oxygen barrier layer is half or less of that of the conventional protective layer composed of metal, the oxygen-barrier property can be ensured. As a result, a small capacitor can be achieved, and a memory including a capacitor can easily be highly integrated as a three-dimensional structure.

In the semiconductor device of the present invention, it is preferable that the first oxygen barrier layer includes a lower layer containing a conductive nitride and in contact with the contact plug, and an upper layer containing a conductive oxide and formed on the lower layer.

In this case, it is preferable that the conductive nitride includes at least one material selected from a group consisting titanium nitride, titanium aluminum nitride, titanium silicon nitride, tantalum nitride, tantalum aluminum nitride or tantalum silicon nitride.

It is preferable that the second oxygen barrier layer is in contact with the side surfaces of the lower layer.

It is preferable that the thickness of the second oxygen barrier layer is between 5 nm and 50 nm inclusively.

It is preferable that the second oxygen barrier layer is composed of an oxide.

It is also preferable that the second oxygen barrier layer contains aluminum oxide ($Al_2O_3$).

It is preferable that the second oxygen barrier layer contains at least one of aluminum oxide ($Al_2O_3$), titanium aluminum oxide (TiAlO) and tantalum aluminum oxide (TaAlO).

It is preferable that the distance between each side surface of the contact plug and the second oxygen barrier layer is between 0 nm and 100 nm inclusively.

It is also preferable that the capacitive insulating film includes at least one material selected from a group consisting $SrBi_2(Ta_xNb_{1-x})_2O_9$, $Pb(Zr_yTi_{1-y})O_3$, $(Ba_zSr_{1-z})TiO_3$, $(Bi_uLa_{1-u})_4Ti_3O_{12}$ (where $0 \leq x \leq 1$, $0 \leq y \leq 1$, $0 \leq z \leq 1$, $0 \leq u \leq 1$) or $Ta_2O_5$.

A method for fabricating a semiconductor device in the present invention includes the steps of: (a) forming an interlayer dielectric film on a semiconductor region; (b) selectively forming a contact plug within the interlayer dielectric film to be in contact with the semiconductor region; (c) forming a first oxygen barrier layer on the interlayer dielectric film to be in contact with the contact plug, the first oxygen barrier layer has a conducting property and prevents the diffusion of oxygen; (d) forming a second oxygen barrier layer on the side surfaces of the first oxygen barrier layer, the second oxygen barrier layer has an insulating property and prevents the diffusion of oxygen; (e) forming a lower electrode to be in contact with the top surface of the first oxygen barrier layer; (f) forming a capacitive insulating film over the lower electrode such that the lower electrode is being covered; (g) forming an upper electrode over the capacitive insulating film such that the capacitive insulating film is being covered; and (h) performing a heat treatment on the capacitive insulating film in an oxygen ambient.

According to the above method of the present invention, the semiconductor device of the present invention that includes the first oxygen barrier layer having a conducting property and for protecting the upper portion of the contact plug, and the second oxygen barrier layer having an insulating property, for protecting the side portions of the first oxygen barrier layer and for preventing the oxidation of the contact plug can be fabricated.

In the method for fabricating the semiconductor device of the present invention, it is preferable that the step (c) further includes a step of forming a lower layer containing a conductive nitride in contact with the contact plug, and a step of forming an upper layer containing a conductive oxide in contact with the lower layer.

It is also preferable that in step (h), the temperature of the heat treatment is between 500° C. and 850° C. inclusively.

Further, it is preferable that the step (d) further includes a step of forming an oxygen-barrier-formation layer over the entire interlayer dielectric film including the first oxygen barrier layer, and a step of performing an etchback process by anisotropic etching the oxygen-barrier-formation layer, thereby forming a second oxygen barrier layer from the oxygen-barrier-formation layer on the side surfaces of the first oxygen barrier layer, where an etching gas having chlorine as the main component is used in the etchback process performed on the oxygen-barrier-formation layer.

DETAILED DESCRIPTION OF THE DRAWINGS

Hereinafter, a preferred embodiment of the present invention is described with reference to the drawings.

Figure 1:
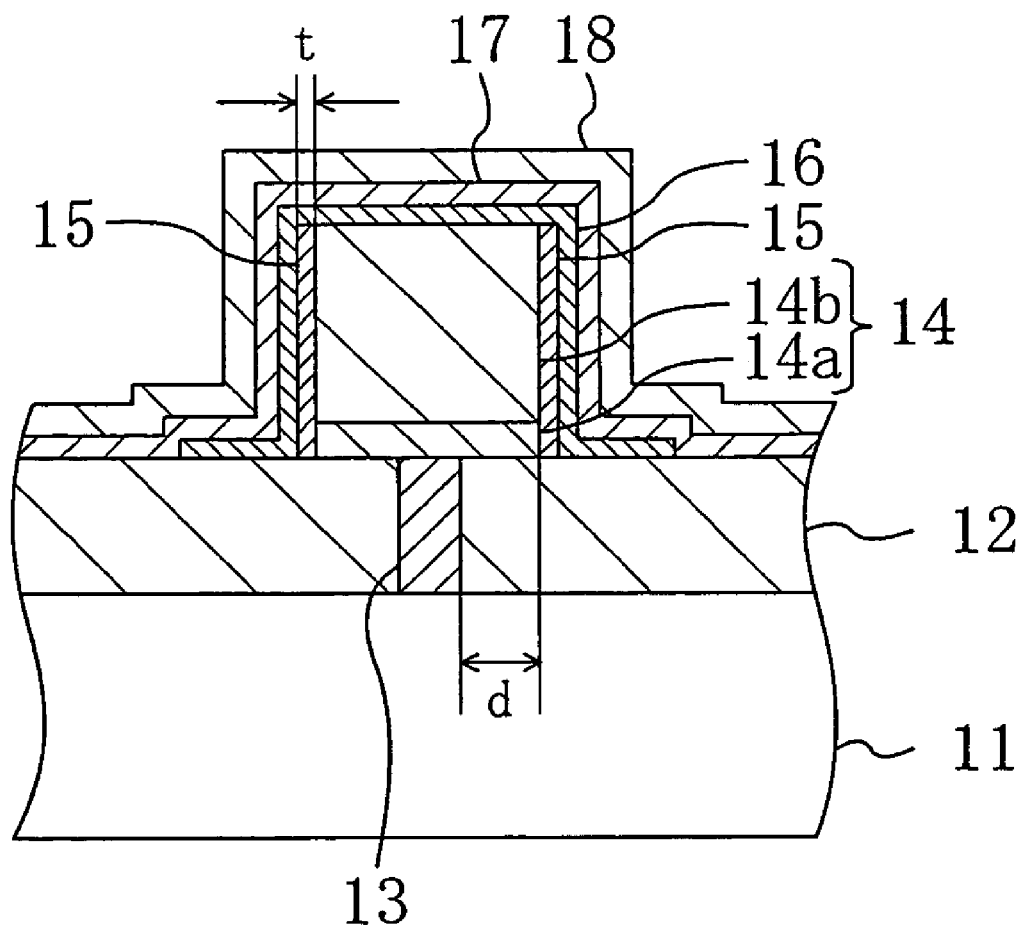
FIG. 1 is a cross-sectional illustration showing the main part of a semiconductor device according to a preferred embodiment of the present invention.

FIG. 1 is an illustration of a semiconductor device according to the preferred embodiment of the present invention, and shows a cross-sectional structure of the main part of a capacitor.

As shown in FIG. 1, for example, an interlayer dielectric film 12 composed of silicon oxide ($SiO_2$) is formed on a semiconductor substrate 11 composed of silicon (Si), and a plug having a diameter of 0.3 μm and composed of polysilicon or tungsten (W) is filled within the interlayer dielectric film 12 to form a contact plug 13.

A conductive oxygen barrier layer 14 is patterned and formed on the interlayer dielectric film 12, and in contact with the contact plug 13 to prevent oxygen from diffusing into the contact plug 13 from above. The conductive oxygen barrier layer 14 is composed of a lower layer 14a, which contains a conductive nitride such as titanium aluminum nitride (TiAlN), and an upper layer 14b, which contains a conductive oxide such as iridium oxide ($IrO_2$). In addition, the size of the conductive oxygen barrier layer 14 in the horizontal direction (with respect to the surface of the substrate) is approximately 0.5 μm, the thickness of the lower layer 14a is between 20 nm and 150 nm, and the desirable thickness of the upper layer 14b is 100 nm or more, of which upper limit depends on the required capacitance of the capacitor.

Although it is not shown in the drawings, a middle layer having an oxygen-barrier property and composed of iridium (Ir) and the like can also be provided between the lower layer 14a and upper layer 14b. In the case where the middle layer is provided, the total thickness of the middle layer and upper layer 14b will be 100 nm or more, of which upper limit depends on the required capacitance of the capacitor such as in the case where only the upper layer 14b is provided.

Further, the conductive nitride composing the lower layer 14a is not limited to titanium aluminum nitride (TiAlN), but can be a material including at least one of titanium aluminum nitride (TiAlN), titanium nitride (TiN), titanium silicon nitride (TiSiN), tantalum nitride (TaN), tantalum aluminum nitride (TaAlN) and tantalum silicon nitride (TaSiN).

An insulating oxygen barrier layer 15 composed of aluminum oxide ($Al_2O_3$) is formed on each side surface of the conductive oxygen barrier layer 14 to prevent oxygen from diffusing into the contact plug 13 from the interface between the lower layer 14a and interlayer dielectric film 12. At this point, the thickness of the insulating oxygen barrier layer 15 is approximately 20 nm. However, the thickness can be between 5 nm through 50 nm, as will be described later in the embodiment. Moreover, it is sufficient for the insulating oxygen barrier layer 15 to be in contact with at least the side surfaces of the lower layer 14a composing the conductive oxygen barrier layer 14. The composition of the insulating oxygen barrier layer 15 is not limited to aluminum oxide, but can be a material including at least one of aluminum oxide ($Al_2O_3$), titanium aluminum oxide (TiAlO) and tantalum aluminum oxide (TaAlO).

A lower electrode 16 having platinum (Pt) as the main component and a thickness between 30 nm and 100 nm is formed over the conductive oxygen barrier layer 14 and the insulating oxygen barrier layer 15, such that it is in contact with the top surface of the conductive oxygen barrier layer 14 and the top and side surfaces of the insulating oxygen barrier layer 15.

A capacitive insulating film 17 composed of a ferroelectric material, for example $SrBi_2(Ta_xNb_{1-x})_2O_9$ (where $0 \leq x \leq 1$), and has a thickness between 30 nm and 100 nm is formed such that it covers the lower electrode 16. An upper electrode 18 having platinum (Pt) as the main component and a thickness between 30 nm and 100 nm is formed such that it covers the capacitive insulating film 17. The ferroelectric material composing the capacitive insulating film 17 is not limited to $SrBi_2(Ta_xNb_{1-x})_2O_9$, but can be a material including at least one of $SrBi_2(Ta_xNb_{1-x})_2O_9$, $Pb(Zr_yTi_{1-y})O_3$, $(Ba_zSr_{1-z})TiO_3$, $(Bi_uLa_{1-u})_4Ti_3O_{12}$ (where $0 \leq x \leq 1$, $0 \leq y \leq 1$, $0 \leq z \leq 1$, $0 \leq u \leq 1$) and $Ta_2O_5$.

Hereinafter, a method for fabricating a semiconductor device having the structure mentioned above is described with reference to the drawings.

FIGS. 2A to 2C and FIGS. 3A and 3B are cross-sectional illustrations showing the sequence of a method for fabricating a semiconductor device according to the preferred embodiment of the present invention.

Figure 2A:
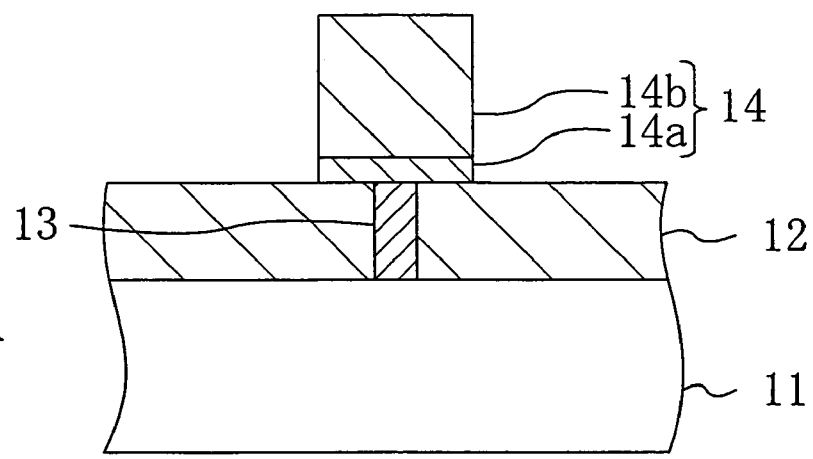
FIGS. 2A to 2C are cross-sectional illustrations showing the sequence of a method for fabricating a semiconductor device according to the preferred embodiment of the present invention.

Firstly, as shown in FIG. 2A, an interlayer dielectric film 12 composed of silicon oxide is deposited on a semiconductor substrate 11 by CVD (Chemical Vapor Deposition). After forming a resist pattern (not shown in drawings) in the interlayer dielectric film 12 by lithography, dry etching using an etching gas containing fluorine (F) is performed on the interlayer dielectric film 12, with the resist pattern functioning as a mask, to form a contact hole having a 0.3 μm diameter. Subsequently, CVD is performed to deposit polysilicon or tungsten film on the entire surface of the interlayer dielectric film 12 and thereby burying the contact hole. A contact plug 13 is then formed by removing the film deposited on the interlayer dielectric film 12 using CMP (Chemical Mechanical Polishing). Thereafter, a lower layer 14a composed of conductive nitride such as TiAlN and an upper layer 14b composed of conductive oxide such as $IrO_2$ are sequentially formed on the interlayer dielectric film 12 by sputtering. Lithography and dry etching using chlorine ($Cl_2$) as an etching gas are then performed to pattern the lower layer 14a and upper layer 14b such that the lower layer 14a covers the top surface of the contact plug 13, and thereby forming a conductive oxygen barrier layer 14 that has a laminated structure composed of the lower layer 14a and upper layer 14b.

Figure 2B:
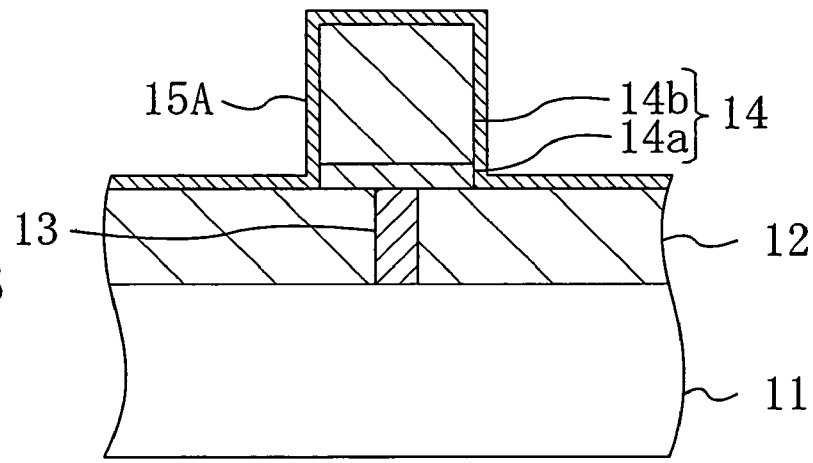

Next, as shown in FIG. 2B, an insulating oxygen-barrier-formation layer 15A composed of aluminum oxide and having a thickness of, for example, approximately 20 nm is deposited over the entire interlayer dielectric film 12 including the conductive oxygen barrier layer 14 by ALD (Atomic Layer Deposition).

Figure 2C:
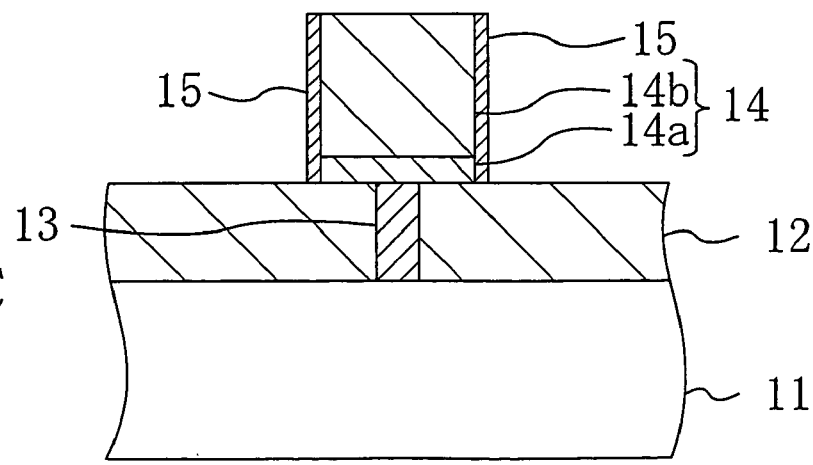

As shown in FIG. 2C, an etchback process is performed by anisotropic etching the entire surface of the oxygen-barrier-formation layer 15A using a compound gas containing chlorine and fluorine. Thereafter, the oxygen-barrier-formation layer 15A is retained on both side surfaces of the conductive oxygen barrier layer 14 to form an insulating oxygen barrier layer 15.

Figure 3A:
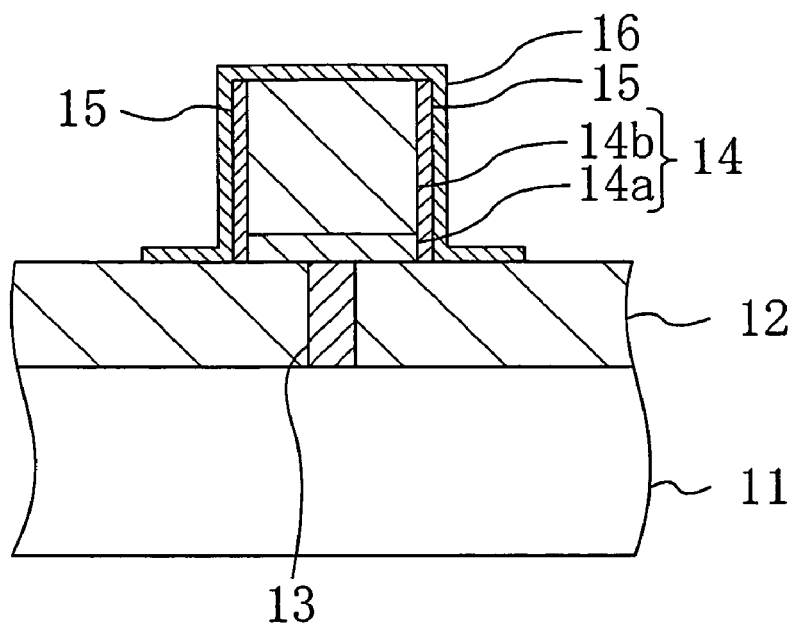
FIGS. 3A and 3B are cross-sectional illustrations showing the sequence of a method for fabricating a semiconductor device according to the preferred embodiment of the present invention.

As shown in FIG. 3A, a metal film having platinum as the main component and a thickness between 30 nm and 100 nm is formed over the entire interlayer dielectric film 12, including the conductive oxygen barrier layer 14 and the insulating oxygen barrier layer 15, by sputtering or CVD. Thereafter, the metal film is patterned by an etching gas containing chlorine to form a lower electrode 16, such that the lower electrode covers the top surface of the conductive oxygen barrier layer 14 and the top and side surfaces of the insulating oxygen barrier layer 15.

Figure 3B:
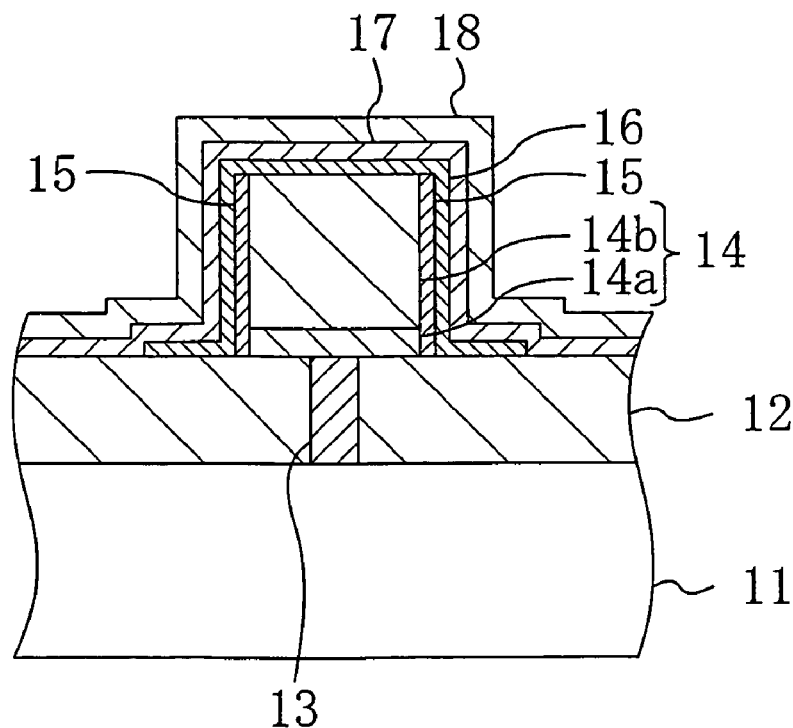

Finally, as shown in FIG. 3B, a capacitive insulating film 17 composed of, for example, $SrBi_2(Ta_xNb_{1-x})_2O_9$ (where $0 \leq x \leq 1$) and having a thickness between 30 nm and 100 nm is formed over the entire interlayer dielectric film 12 and covering the lower electrode 16 by sputtering or CVD. Subsequently, by performing sputtering or CVD, an upper electrode 18 is provided on the capacitive insulating film 17 by forming a metal film having platinum as the main component and a thickness between 30 nm and 100 nm. The ferroelectric material composing the capacitive insulating film 17 is then re-crystallized by performing a heat treatment in an oxygen ambient of 500° C. to 850° C.

According to the present embodiment, under the temperature used in the heat treatment for crystallizing the capacitive insulating film 17, even if the thickness of the insulating oxygen barrier layer 15 is set at 50 nm or less, the diffusion of oxygen from the interface between the lower layer 14a of the conductive oxygen barrier layer 14 and the interlayer dielectric film 12 can be suppressed. In other words, even if the insulating oxygen barrier layer 15 is provided on the side surface of the conductive oxygen barrier layer 14, since the increase in size of the capacitor in the horizontal direction is only half, or less, of that of the conventional capacitor, a capacitor having a three-dimensional structure and applicable to a highly integrated memory can be achieved.

In addition, although the contact plug 13 is formed on and electrically in contact with the semiconductor substrate 11, the contact plug 13 can also be provided on any of the other semiconductor layers formed on the semiconductor substrate 11.

Figure 4:
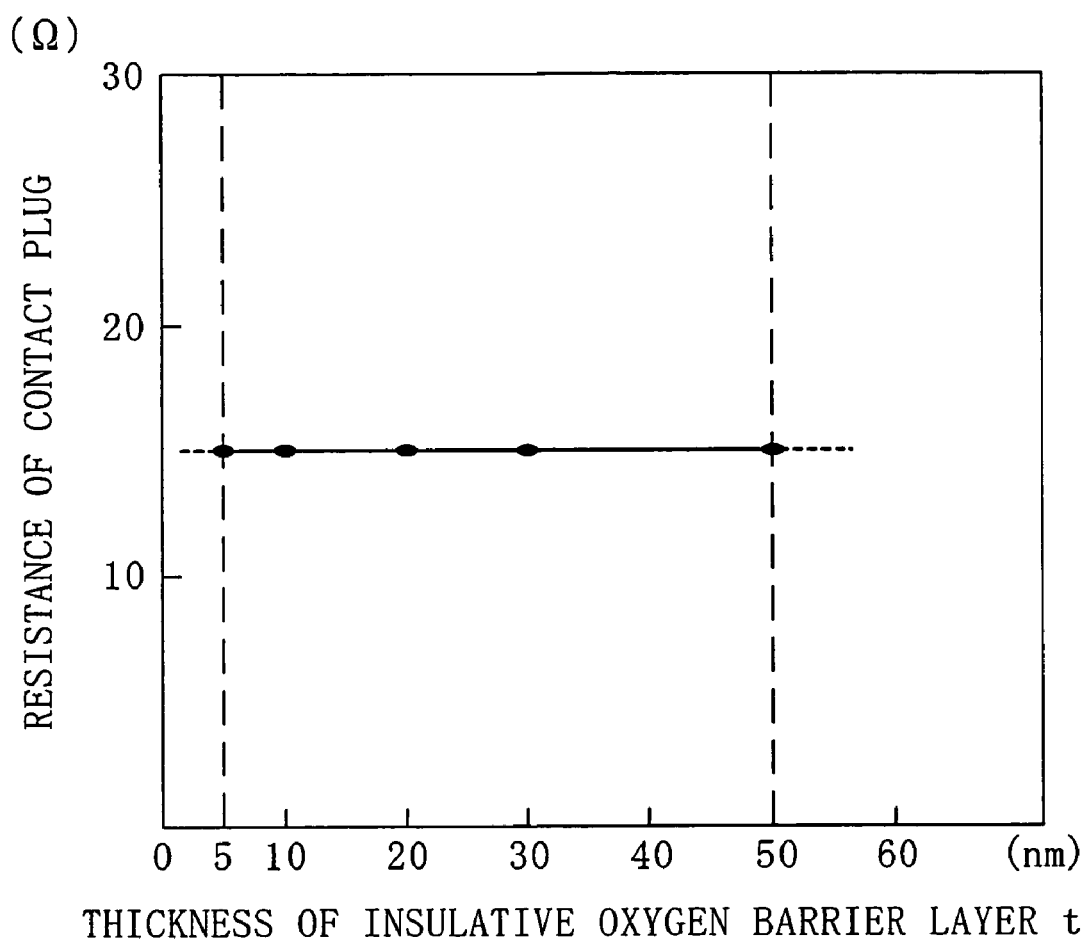
FIG. 4 is a graph showing the dependency of the resistance of a contact plug to the thickness of an insulating oxygen barrier layer in a semiconductor device according to the preferred embodiment of the present invention.

FIG. 4 illustrates the changes in resistance of the contact plug 13 with respect to the changes in thickness (the reference character t in FIG. 1) of the insulating oxygen barrier layer 15 in the semiconductor device according to the present embodiment. The design and manufacturing conditions are as follows: the material of the contact plug 13 is tungsten having a diameter of 0.3 μm; the material of the lower layer 14a of the conductive oxygen barrier layer 14 is titanium aluminum nitride having a thickness of 100 nm; the material of the insulating oxygen barrier layer 15 is aluminum oxide; and the distance between the contact plug 13 and the insulating oxygen barrier layer 15 (the reference character d in FIG. 1) is 100 nm. In addition, the ambient for heat treatment is 100% oxygen gas and the temperature for heat treatment is 800° C.

As clearly shown in FIG. 4, the resistance of the contact plug 13 is completely unchanged when the thickness of the insulating oxygen barrier layer 15 is within the range of 5 nm to 50 nm. In other words, as compared to the prior art, even if the thickness t of the insulating oxygen barrier layer 15 covering the side surfaces of the lower layer 14a of the conductive oxygen barrier layer 14 is reduced by half to one twentieth, the increase in resistance of the contact plug 13 due to oxidation caused by oxygen diffusion does not occur.

Figure 5:
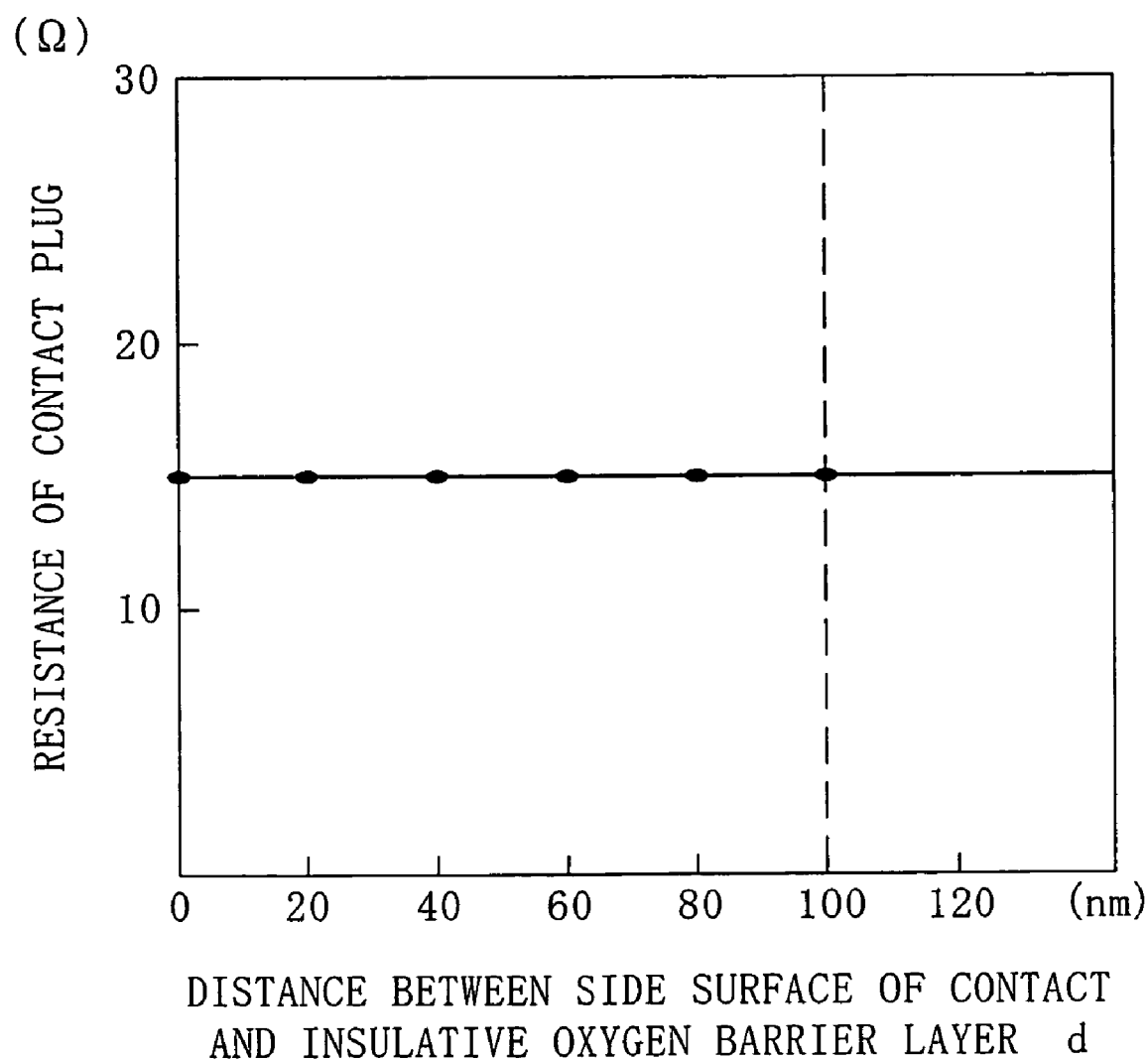
FIG. 5 is a graph showing the dependency of the resistance of a contact plug to the distance between each side of the contact plug and an insulating oxygen barrier layer in a semiconductor device according to the preferred embodiment of the present invention.

FIG. 5 illustrates the changes in resistance of the contact plug 13 with respect to the changes in distance d between each side surface of the contact plug 13 and the insulating oxygen barrier layer 15 in the semiconductor device according to the present embodiment. The design and manufacturing conditions are as follows: the material of the contact plug 13 is tungsten having a diameter of 0.3 μm; the material of the lower layer 14a of the conductive oxygen barrier layer 14 is titanium aluminum nitride having a thickness of 100 nm; and the material of the insulating oxygen barrier layer 15 is aluminum oxide having a thickness of 20 nm. In addition, the ambient for heat treatment is 100% oxygen gas and the temperature for heat treatment is 800° C.

As clearly shown in FIG. 5, as long as the distance d between each side surface of the contact plug 13 and the insulating oxygen barrier layer 15 is 0 nm or more, even if the size of the conductive oxygen barrier layer 14 in the horizontal direction is the same as that of the contact plug 13, the resistance of the contact plug 13 is completely unchanged. Hence as compared to the prior art, the size of the capacitor in the horizontal direction can be greatly reduced by providing the insulating oxygen barrier layer 15 of the present embodiment on the surfaces of the conductive oxygen barrier layer 14.

Figure 6:
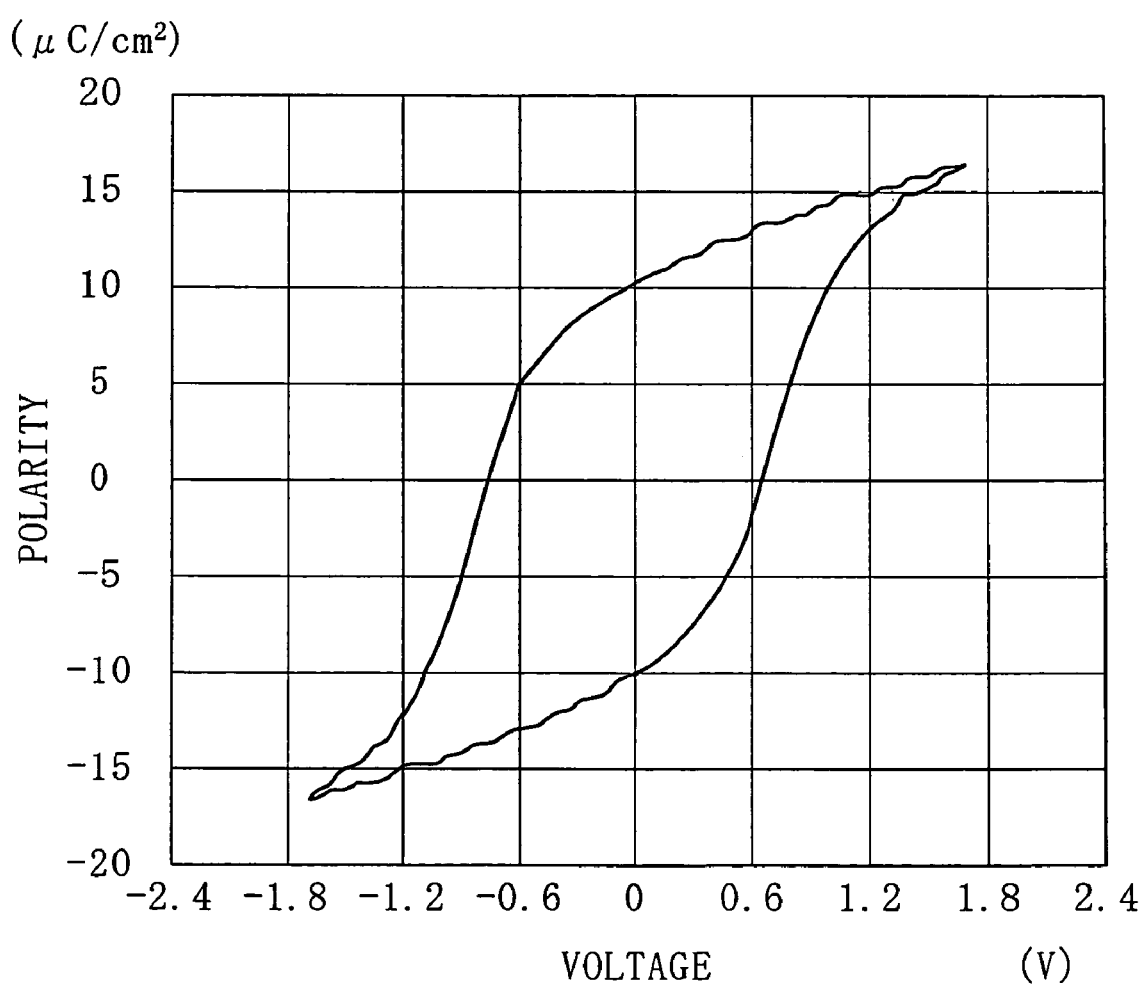
FIG. 6 is a graph showing the polarity property of a semiconductor device according to the preferred embodiment of the present invention.
Figure 7:
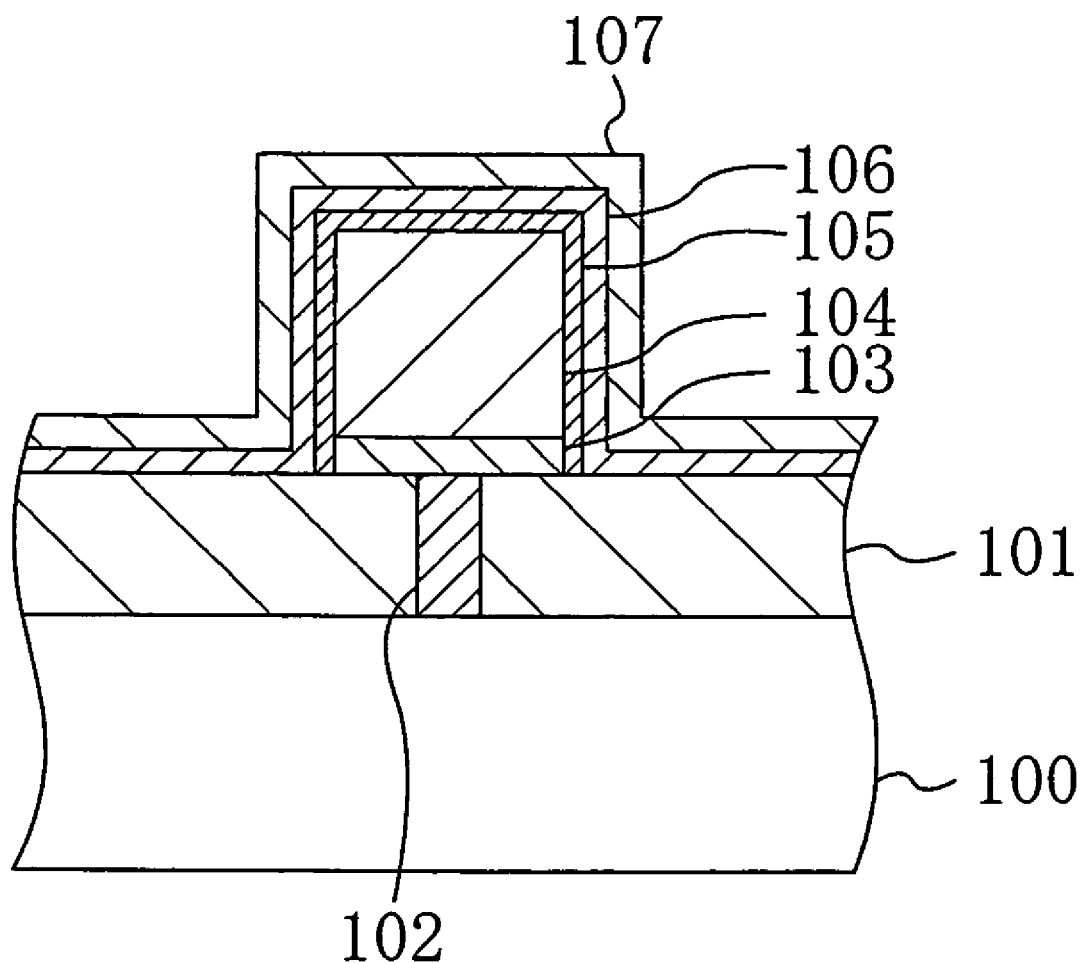
FIG. 7 is a cross-sectional illustration showing the main part of a conventional capacitor.

FIG. 6 illustrates the voltage dependency of the polarization of the semiconductor device according to the present embodiment. The design and manufacturing conditions are as follows: the material of the lower layer 14a of the conductive oxygen barrier layer 14 is titanium aluminum nitride having a thickness of 100 nm and the material of the upper layer 14b is iridium having a thickness of 400 nm; the surface area of the conductive oxygen barrier layer 14 is 0.5 μm×0.5 μm; the material of the insulating oxygen barrier layer 15 is aluminum oxide having a thickness of 20 nm; the material of the lower electrode 16 is platinum having a thickness of 50 nm; the length of the portion of the lower electrode 16 provided on the interlayer dielectric film 12 from the insulating oxygen barrier layer 15 is 100 nm; and the thickness of the capacitive insulating film 17 is 90 nm. In addition, the ambient for heat treatment is 100% oxygen gas and the temperature for heat treatment is 800° C.

As shown in FIG. 6, an extremely desirable polarization can be achieved from the semiconductor device of the present embodiment.

What is claimed is:

1. A semiconductor device comprising:
   a contact plug formed within an interlayer dielectric film provided on a semiconductor region, and is electrically connected to the semiconductor region;
   a first oxygen barrier layer formed on the interlayer dielectric film to be in contact with the contact plug, the first oxygen barrier layer has a conducting property and prevents the diffusion of oxygen:
   a second oxygen barrier layer formed in contact with the side surfaces of the first oxygen barrier layer, the second oxygen barrier layer has an insulating property and prevents the diffusion of oxygen;
   a lower electrode formed to cover the top surface of the first oxygen barrier layer and the outer portions of the side surfaces of the second oxygen barrier layer,
   a capacitive insulating film formed on the lower electrode; and
   an upper electrode formed on the capacitive insulating film.

2. The device of claim 1 wherein the first oxygen barrier layer includes a lower layer and an upper layer, the lower layer contains a conductive nitride and is in contact with the contact plug, and the upper layer contains a conductive oxide and is formed on the lower layer.

3. The device of claim 2, wherein the conductive nitride includes at least one material selected from a group consisting titanium nitride, titanium aluminum nitride, titanium silicon nitride, tantalum nitride, tantalum aluminum nitride and tantalum silicon nitride.

4. The device of claim 2, wherein the second oxygen barrier layer is in contact with the side surfaces of the lower layer.

5. The device of claim 1, wherein the thickness of the second oxygen barrier layer is between 5 nm and 50 nm inclusively.

6. The device of claim 1, wherein the second oxygen barrier layer is composed of an oxide.

7. The device of claim 1, wherein the second oxygen barrier layer contains aluminum oxide.

8. The device of claim 1, wherein the second oxygen barrier layer contains at least one of aluminum oxide, titanium aluminum oxide and tantalum aluminum oxide.

9. The device of claim 1, wherein the distance between each side surface of the contact plug and the second oxygen barrier layer is between 0 nm and 100 nm inclusively.

10. The device of claim 1, wherein the capacitive insulating film includes at least one material selected from a group consisting $SrBi_2(Ta_xNb_{1-x})_2O_9$, $Pb(Zr_yTi_{1-y})O_3$, $(Ba_zSr_{1-z})TiO_3$, $(Bi_uLa_{1-u})_4Ti_3O_{12}$ (where $0 \leq x \leq 1$, $0 \leq y \leq 1$, $0 \leq z \leq 1$, $0 \leq u \leq 1$) and $Ta_2O_5$.

* * * * *